US009269665B2

(12) United States Patent
Wada et al.

(10) Patent No.: US 9,269,665 B2
(45) Date of Patent: Feb. 23, 2016

(54) SEMICONDUCTOR DEVICE AND METHOD OF FABRICATING THE SAME

(71) Applicant: KABUSHIKI KAISHA TOSHIBA, Minato-ku (JP)

(72) Inventors: Makoto Wada, Kanagawa (JP); Kazuyuki Higashi, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/597,826

(22) Filed: Jan. 15, 2015

(65) Prior Publication Data

US 2015/0123286 A1 May 7, 2015

Related U.S. Application Data

(60) Continuation of application No. 13/270,668, filed on Oct. 11, 2011, now abandoned, which is a division of application No. 12/239,236, filed on Sep. 26, 2008, now Pat. No. 8,058,730.

(30) Foreign Application Priority Data

Sep. 28, 2007 (JP) ................................ 2007-256354

(51) Int. Cl.
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/76801* (2013.01); *H01L 21/76829* (2013.01);
(Continued)

(58) Field of Classification Search
CPC .............. H01L 23/5226; H01L 23/53295; H01L 21/76801; H01L 23/5329; H01L 21/76829; H01L 21/76834; H01L 21/76832; H01L 21/76807; H01L 21/76802; H01L 21/02063
USPC ......... 438/622–624, 638, 778, 780–782, 787, 438/790, 793, 794; 257/E21.576, E21.579
See application file for complete search history.

(56) References Cited

U.S. PATENT DOCUMENTS 6,362,528 B2   3/2002   Anand
6,383,913 B1   5/2002   Tsai et al.
(Continued)

FOREIGN PATENT DOCUMENTS

JP    11-186391    7/1999
JP    2004-14901   1/2004
(Continued)

*Primary Examiner* — David Vu
(74) *Attorney, Agent, or Firm* — Oblon, McClelland, Maier & Neustadt, L.L.P.

(57) ABSTRACT

A semiconductor device according to one embodiment includes: a semiconductor substrate provided with a semiconductor element; a first conductive member formed on the semiconductor substrate; a first insulating film formed on the same layer as the first conductive member; a second conductive member formed so as to contact with a portion of an upper surface of the first conductive member; a second insulating film formed on the first insulating film so as to contact with a portion of the upper surface of the first conductive member, and including at least one type of element among elements contained in the first insulating film except Si; and an etching stopper film formed on the second insulating film so as to contact with a portion of a side surface of the second conductive member, and having an upper edge located below the upper surface of the second conductive member.

22 Claims, 15 Drawing Sheets

(52) U.S. Cl.
CPC .... *H01L21/76832* (2013.01); *H01L 21/76834* (2013.01); *H01L 23/5329* (2013.01); *H01L 23/53295* (2013.01); *H01L 2924/0002* (2013.01)

(56) References Cited

U.S. PATENT DOCUMENTS

| | | | |
|---|---|---|---|
| 6,407,011 | B1 | 6/2002 | Ikeda et al. |
| 6,451,683 | B1 | 9/2002 | Farrar |
| 6,838,771 | B2 | 1/2005 | Tanaka et al. |
| 7,019,400 | B2 | 3/2006 | Iguchi et al. |
| 7,119,439 | B2 | 10/2006 | Watanabe et al. |
| 7,170,173 | B2 | 1/2007 | Leuschner et al. |
| 7,176,121 | B2 * | 2/2007 | Ohmori ............ H01L 21/76807 257/E21.576 |
| 7,348,672 | B2 | 3/2008 | Chen et al. |
| 7,514,792 | B2 | 4/2009 | Hasegawa |
| 7,619,310 | B2 | 11/2009 | Huebinger et al. |
| 2002/0039840 | A1 | 4/2002 | Watatani |
| 2003/0183905 | A1 | 10/2003 | Karakawa |
| 2003/0227086 | A1 | 12/2003 | Otsuka et al. |
| 2004/0152334 | A1 | 8/2004 | Ohto et al. |
| 2004/0155342 | A1 | 8/2004 | Usami et al. |
| 2005/0253266 | A1 | 11/2005 | Tsumura et al. |
| 2006/0019491 | A1 | 1/2006 | Soda |

FOREIGN PATENT DOCUMENTS

| | | |
|---|---|---|
| JP | 2004-128050 | 4/2004 |
| JP | 2005-236141 | 9/2005 |
| JP | 2006-19480 | 1/2006 |

\* cited by examiner

US 9,269,665 B2

SEMICONDUCTOR DEVICE AND METHOD OF FABRICATING THE SAME

CROSS-REFERENCE TO RELATED APPLICATIONS

This application is based upon and claims the benefit of a continuation of U.S. application Ser. No. 13/270,668 filed Oct. 11, 2011, which is a divisional of U.S. application Ser. No. 12/239,236 filed Sep. 26, 2008, and priority from prior Japanese Patent Application No. 2007-256354, filed on Sep. 28, 2007, the entire contents of which are incorporated herein by reference.

BACKGROUND

In a wiring structure of a semiconductor device, an etching stopper film is generally used for equalizing the depth when forming a wiring trench, a via hole or the like by etching and for inhibiting overetching to an interlayer insulating film which is a lower layer (for example, disclosed in Japanese Patent Laid-Open No. 2006-19480).

BRIEF SUMMARY

A semiconductor device according to one embodiment includes: a semiconductor substrate provided with a semiconductor element; a first conductive member formed on the semiconductor substrate; a first insulating film formed on the same layer as the first conductive member; a second conductive member formed so as to contact with a portion of an upper surface of the first conductive member; a second insulating film formed on the first insulating film so as to contact with a portion of the upper surface of the first conductive member, and including at least one type of element among elements contained in the first insulating film except Si; and an etching stopper film formed on the second insulating film so as to contact with a portion of a side surface of the second conductive member, and having an upper edge located below the upper surface of the second conductive member.

A semiconductor device according to another embodiment includes: a semiconductor substrate provided with a semiconductor element; a first conductive member formed on the semiconductor substrate; a first insulating film formed on the same layer as the first conductive member; a second conductive member formed so as to contact with a portion of an upper surface of the first conductive member; a second insulating film formed on the first insulating film so as to contact with a portion of the upper surface of the first conductive member; and an etching stopper film formed on the second insulating film so as to contact with a portion of a side surface of the second conductive member, having an upper edge located below the upper surface of the second conductive member, and a permittivity higher than that of the second conductive member.

A method of fabricating a semiconductor device according to another embodiment includes: forming a first insulating film on a semiconductor device provided with a semiconductor element; forming a first conductive member in the first insulating film; forming a second insulating film on upper surfaces of the first insulating film and the first conductive member; sequentially forming an etching stopper film and a third insulating film on the second insulating film; forming a trench by etching the third insulating film so as to expose the etching stopper film; deepening the trench so as to expose the first conductive member by removing the etching stopper film and the second insulating film located under the trench; and forming a second conductive member in the trench which is deepened.

DETAILED DESCRIPTION

First Embodiment

Figure 1:
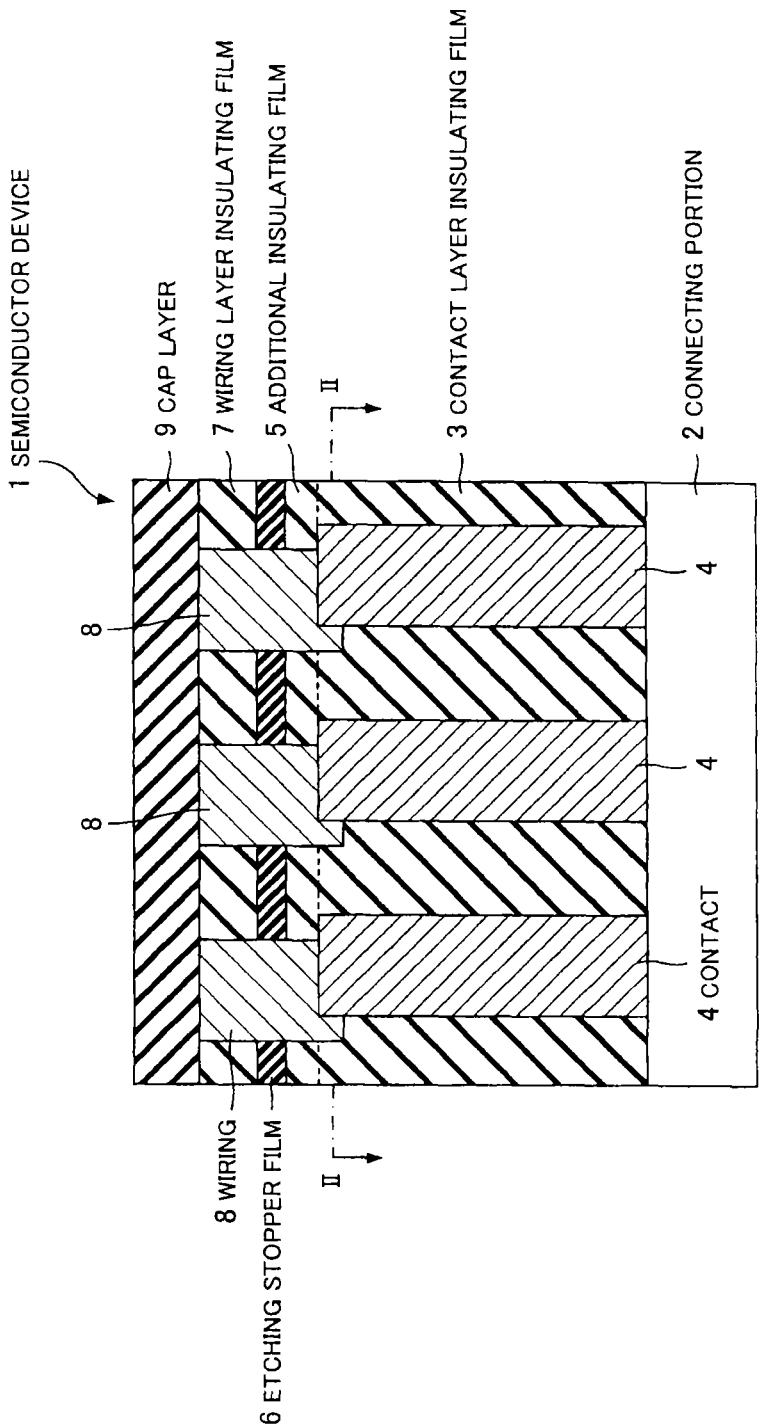
FIG. 1 is a cross sectional view of a semiconductor device according to a first embodiment.
Figure 2A:
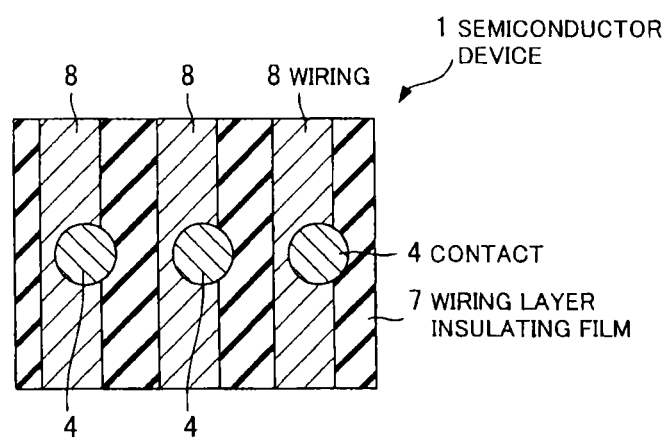
FIG. 2A and FIG. 2B are cross sectional views of the semiconductor device according to the first embodiment when a cut surface taken on line II-II of FIG. 1 is viewed in a direction indicated by an arrow in the figure.
Figure 2B:
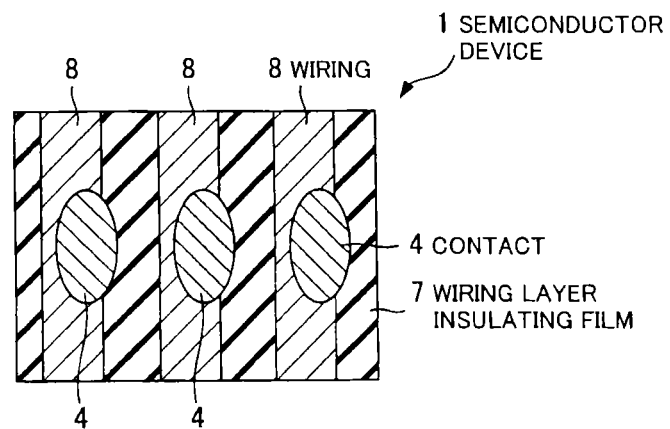

FIG. 1 is a cross sectional view of a semiconductor device according to a first embodiment. Furthermore, FIG. 2A and FIG. 2B are cross sectional views when a cut surface taken on line II-II of FIG. 1 is viewed in a direction indicated by an arrow in the figure.

A semiconductor device 1 has a semiconductor substrate having a semiconductor element on a surface thereof and a multilayer wiring structure laminated on the semiconductor substrate. FIG. 1 is a cross sectional view showing a portion of this multilayer wiring structure.

The semiconductor device 1 has a connecting portion 2, a contact 4 electrically connected to the connecting portion 2, a contact layer insulating film 3 formed on the same layer as the contact 4, a wiring 8 formed on the contact 4 so as to contact with a portion of an upper surface of the contact 4, an additional insulating film 5 formed on the contact layer insulating film 3 so as to contact with a portion of the upper surface of the contact 4 and a portion of a side surface of the wiring 8 and comprising the same material as the contact layer insulating film 3, an etching stopper film 6 formed on the additional insulating film 5 so as to contact with a portion of the side surface of the wiring 8 and having an upper edge located below an upper surface of the wiring 8, a wiring layer insulating film 7 formed on the etching stopper film 6 so as to contact with the side surface of the wiring 8, and a cap layer 9 formed on the upper surface of the wiring 8 and the wiring layer insulating film 7. Note that, a layout of the contact 4, the wiring 8 or the like is not limited to that shown in FIG. 1.

The connecting portion 2 is a contact portion of a semiconductor substrate, a semiconductor element or the like. Concretely, it is a contact portion of a source/drain region or a gate electrode, for example.

The wiring 8 comprises, for example, a conductive material such as Cu or the like. Note that, the wiring 8 may have a structure having a barrier metal on the surface thereof for preventing diffusion of metals in the wiring 8. The barrier metal comprises, for example, a metal such as Ta, Ti, W, Ru, Mn or the like, or compounds of these metals.

The contact 4 comprises, for example, a conductive material such as W, Cu, Al or the like. Similarly to the wiring 8, the contact 4 may have a structure having a barrier metal on the surface thereof for preventing diffusion of metals in the contact 4. Furthermore, a cross-sectional shape of the contact 4 may be a nearly perfect circle as shown in FIG. 2A or an elliptical shape as shown in FIG. 2B.

The contact layer insulating film 3 comprises, for example, TEOS (Tetraethoxysilane) or Si oxide such as $SiO_2$, SiOC which is C-doped $SiO_2$, SiON which is N-doped $SiO_2$, SiOF which is F-doped $SiO_2$, BPSG which is B and P-doped $SiO_2$ or the like. Furthermore, an organic insulating material such as SiOCH, polymethylsiloxane, polyarylene, benzoxazole or the like may be used.

For a material of the wiring layer insulating film 7, it is possible to use the same material as the contact layer insulating film 3.

The etching stopper film 6 comprises an insulating material such as SiN, SiC, SiOC, SiCN, SiON or the like. Furthermore, since the etching stopper film 6 functions as an etching stopper when etching the wiring layer insulating film 7, it is preferable that the material of the etching stopper film 6 has a high etching selectivity with respect to the wiring layer insulating film 7.

Since the etching stopper film 6 and the contact layer insulating film 3 are formed of different materials, misfit, crystal defects, unstable connecting bond or the like which may be a diffusion path of electron are present on an interface between them. Therefore, a leak current is likely to occur on the interface between the etching stopper film 6 and the contact layer insulating film 3. In addition, breakdown is likely to occur when applying high voltage. Meanwhile, since the additional insulating film 5 and the contact layer insulating film 3 comprise the same material, there is less misfit on the interface between them, crystal defects decrease and connecting bond which was unstable is terminated on the same film. Furthermore, since adhesiveness of the interface is improved, these problems are unlikely to occur.

Figure 3A:
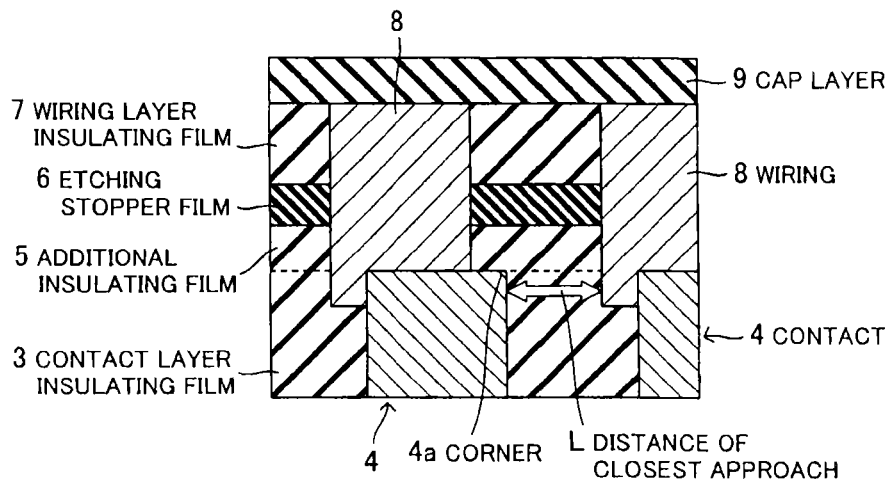
FIG. 3A and FIG. 3B are enlarged partial views of the semiconductor device according to the first embodiment and a semiconductor device as a comparative example.

FIG. 3A is an enlarged partial view of the wiring 8 of the semiconductor device 1 according to this embodiment. In a miniaturized wiring structure, a displacement (or misalignment) between a position in which the wiring is formed and a position in which the contact is formed often occurs due to a problem such as matching accuracy of lithography. In the semiconductor device 1 according to this embodiment, there is a displacement between a position in which the wiring 8 is formed and a position in which the contact 4 is formed, and a distance between the contact 4 and the adjacent wiring 8 becomes shorter than a distance between the adjacent contacts 4 and a distance between the adjacent wirings 8. As a result, the distance between the contact 4 and the adjacent wiring 8 becomes a distance of closest approach L between adjacent conductive members (a pair of the wiring 8 and the contact 4).

Figure 3B:
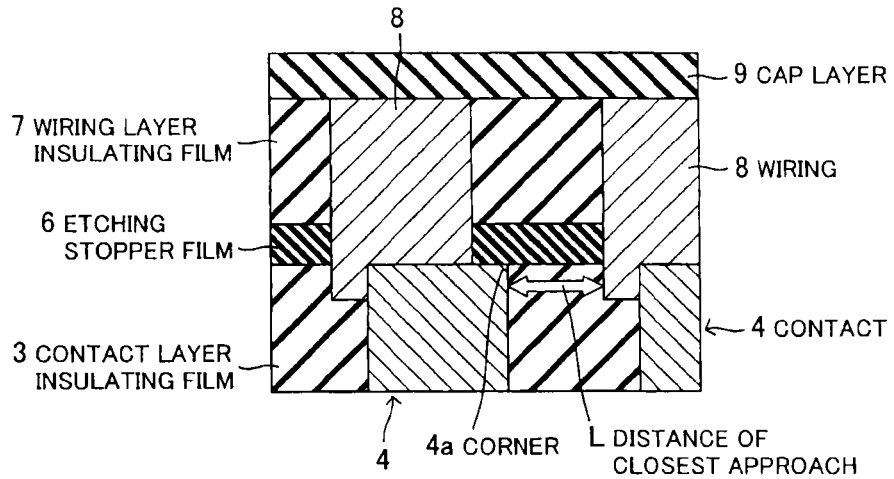

FIG. 3B shows a wiring structure when directly forming the etching stopper film 6 on the upper surfaces of the contact layer insulating film 3 and the contact 4 without forming the additional insulating film 5. In this case, as shown in FIG. 3B, since the distance of a path passing through the interface between the etching stopper film 6 and the contact layer insulating film 3 which comprises different materials is the distance of closest approach L, it is likely to become a leak current pathway and the breakdown is likely to occur when applying high voltage. Furthermore, since the upper rim of the contact 4 is a corner 4a to which electric field is likely to be focused and the interface between the etching stopper film 6 and the contact layer insulating film 3 directly contacts with this corner 4a, the leak current and the breakdown are likely to occur.

In the semiconductor device 1 according to this embodiment, as shown in FIG. 3A, the distance of closest approach L is not an interface between the members comprising different materials due to an existence of the additional insulating film 5 between the contact layer insulating film 3 and the etching stopper film 6 and between the contact 4 and the etching stopper film 6, misfit or crystal defects or the like decrease and adhesiveness is improved, thus, it is possible to prevent the leak current and the breakdown is unlikely to occur even if higher voltage is applied. Furthermore, since the corner 4a of the contact does not contact with the interface between the members comprising different materials, it is possible to inhibit the generation of the leak current and the breakdown in the same way.

Note that, it is preferable that the additional insulating film 5 has a thickness of 3 nm or more for effectively inhibiting the generation of the leak current and the breakdown. It is because a uniform and stable film can be formed in a wafer plane by forming a film with a thickness of 3 nm or more.

The cap layer 9 comprises an insulating material such as SiC, SiOC, SiN or the like.

An example of the processes for fabricating the semiconductor device 1 according to this embodiment will be described hereinafter.

FIG. 4A to FIG. 4I are cross sectional views showing processes for fabricating the semiconductor device according to the first embodiment.

Figure 4A:
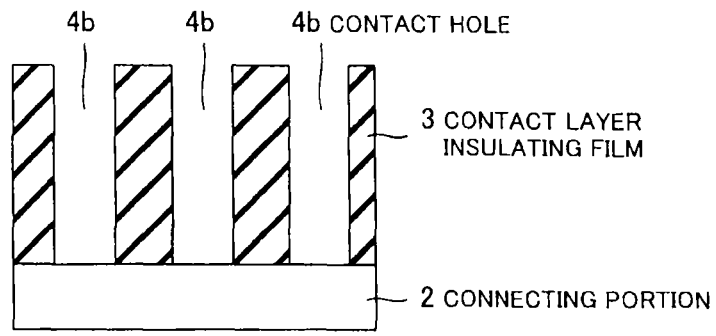
FIG. 4A to FIG. 4I are cross sectional views showing processes for fabricating the semiconductor device according to the first embodiment.

Firstly, as shown in FIG. 4A, after depositing the contact layer insulating film 3 on the connecting portion 2 by a CVD (Chemical Vapor Deposition) method or the like, for example, this deposited film is patterned by a photolithographic method and an RIE (Reactive Ion Etching) method, which results in that a contact hole 4b for the contact 4 is formed.

Figure 4B:
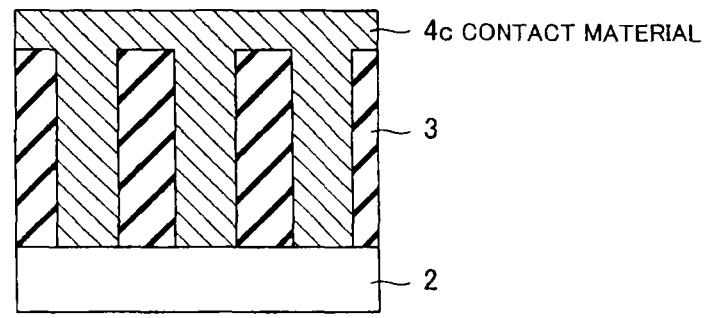

Next, as shown in FIG. 4B, a contact material 4c is formed in the contact hole 4b. For example, when using W for the contact material 4c, for example, after forming a TiN film as a barrier metal by the CVD method, W is formed by the ALD (Atomic Layer Deposition) method or the plasma CVD method.

Figure 4C:
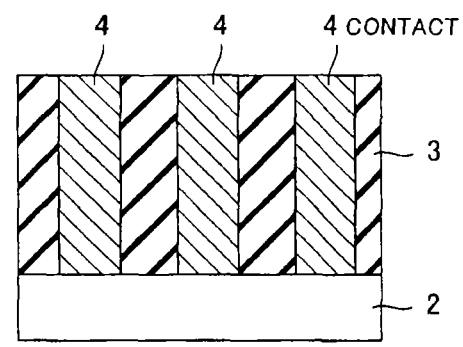

Next, as shown in FIG. 4C, the upper excess portion of the contact material 4c is removed by applying planarization treatment such as CMP (Chemical Mechanical Polishing) or the like, which result in that the contact 4 is formed.

Figure 4D:
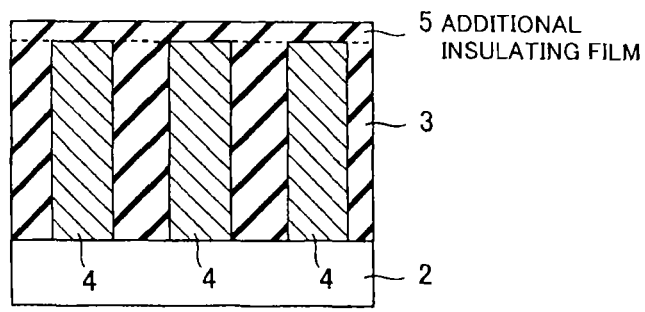

Next, as shown in FIG. 4D, the additional insulating film 5 is formed on the contact layer insulating film 3 and the contact 4 by the CVD method or the like. Note that, although the additional insulating film 5 is formed of a material substantially same as that of the contact layer insulating film 3, a formation method may be different. Furthermore, mismatches may be generated between chemical composition ratio of materials of the additional insulating film 5 and that of the contact layer insulating film 3 in accordance with the difference of the formation method, the materials of them are regarded as substantially same. For example, when the contact layer insulating film 3 and the additional insulating film 5 are $SiO_2$ films, it is possible to form by the plasma CVD method using TEOS gas, or the plasma CVD method, the thermal oxidation method, the ALD method or the like using $SiH_4$ gas, and when formed by the CVD method using TEOS gas, the composition ratio of O of $SiO_2$ may be shifted from 2. As an example, it is possible to form the contact layer insulating film 3 by the plasma CVD method using $SiH_4$ gas and to form the additional insulating film 5 by the plasma CVD method using TEOS gas.

Figure 4E:
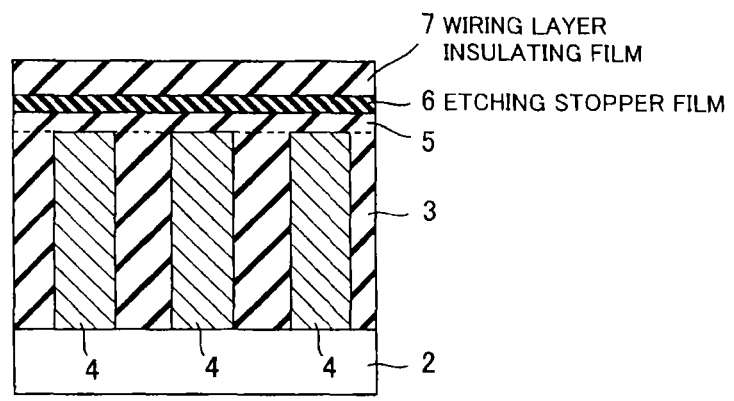

Next, as shown in FIG. 4E, the etching stopper film 6 and the wiring layer insulating film 7 are sequentially formed on the additional insulating film 5 by the CVD method or the like.

Figure 4F:
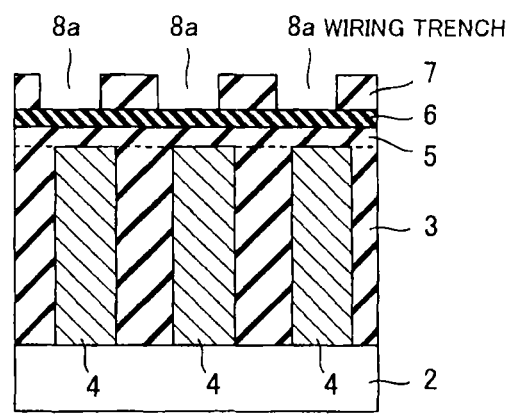

Next, as shown in FIG. 4F, a wiring trench 8a for the wiring 8 is formed by, for example, patterning the wiring layer insulating film 7 by the photolithographic method and the RIE method. At this time, the depth of the wiring trench 8a is equalized by the etching stopper film 6.

Figure 4G:
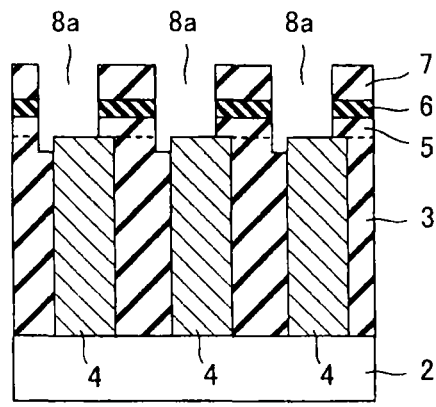

Next, as shown in FIG. 4G, the wiring trench 8a is deepened by removing the etching stopper film 6 and the additional insulating film 5 under the wiring trench 8a so as to expose at least a portion of the upper surface of the contact 4. At this time, as shown in FIG. 4G, the contact layer insulating film 3 is partially removed by displacement between the position of the contact 4 and the position of the wiring trench 8a, the removed portion may be a portion of the wiring trench 8a. Furthermore, by intentionally deepening the wiring trench 8a, it is possible to improve voltage endurance characteristics by extending a distance between a corner of a lower rim of the wiring 8 and the corner 4a of the upper rim of the contact 4 to which electric field is likely to be focused.

Figure 4H:
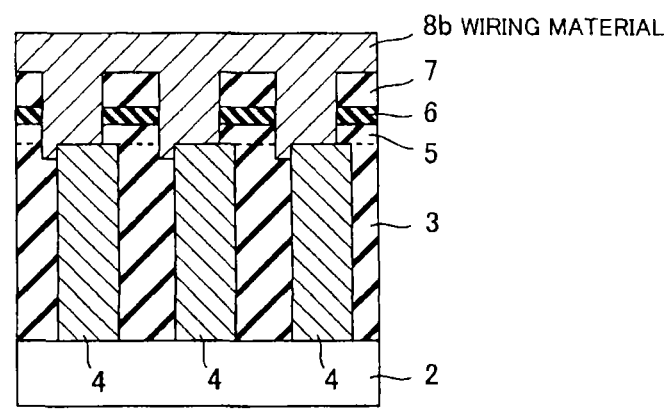

Next, as shown in FIG. 4H, a wiring material 8b is formed in the wiring trench 8a. For example, when using Cu as the wiring material 8b, the wiring material 8b is formed, for example, by forming a Ti or Ta film as a barrier metal by a sputtering method or the like, sequentially forming a Cu seed film by the sputtering method, and then, plating a Cu film thereon.

Figure 4I:
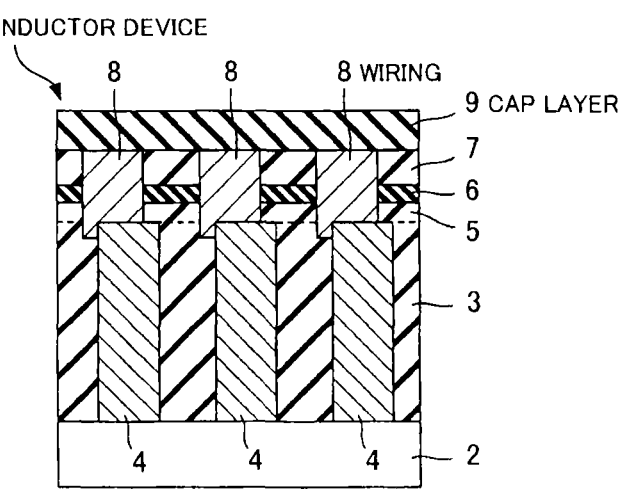

Next, as shown in FIG. 4I, the upper excess portion of the wiring material 8b is removed by applying a planarization treatment such as the CMP or the like, which result in that the wiring 8 is formed. After that, the cap layer 9 is formed on the wiring layer insulating film 7 and the wiring 8 by the CVD method or the like.

According to the first embodiment, by forming the additional insulating film 5 between the contact layer insulating film 3 and the etching stopper film 6 and between the contact 4 and the etching stopper film 6, it is possible to prevent the distance of the path, which is passing through the interface between members comprising different materials, from becoming the distance of closest approach L, to inhibit the generation of the leak current and the breakdown, and to improve leak-resistant characteristics and voltage endurance characteristics.

Furthermore, in the same way, it is possible to inhibit the generation of the leak current and the breakdown, and to improve the leak-resistant characteristics and the voltage endurance characteristics by isolating the interface between the members comprising different materials from the corner 4a of the contact 4 to which electric field is focused.

Second Embodiment

A second embodiment is different from the first embodiment in that an additional insulating film 10 comprising a material different from that of the contact layer insulating film 3 is used as an additional insulating film. The explanation will be omitted for the points same as the first embodiment.

Figure 5:
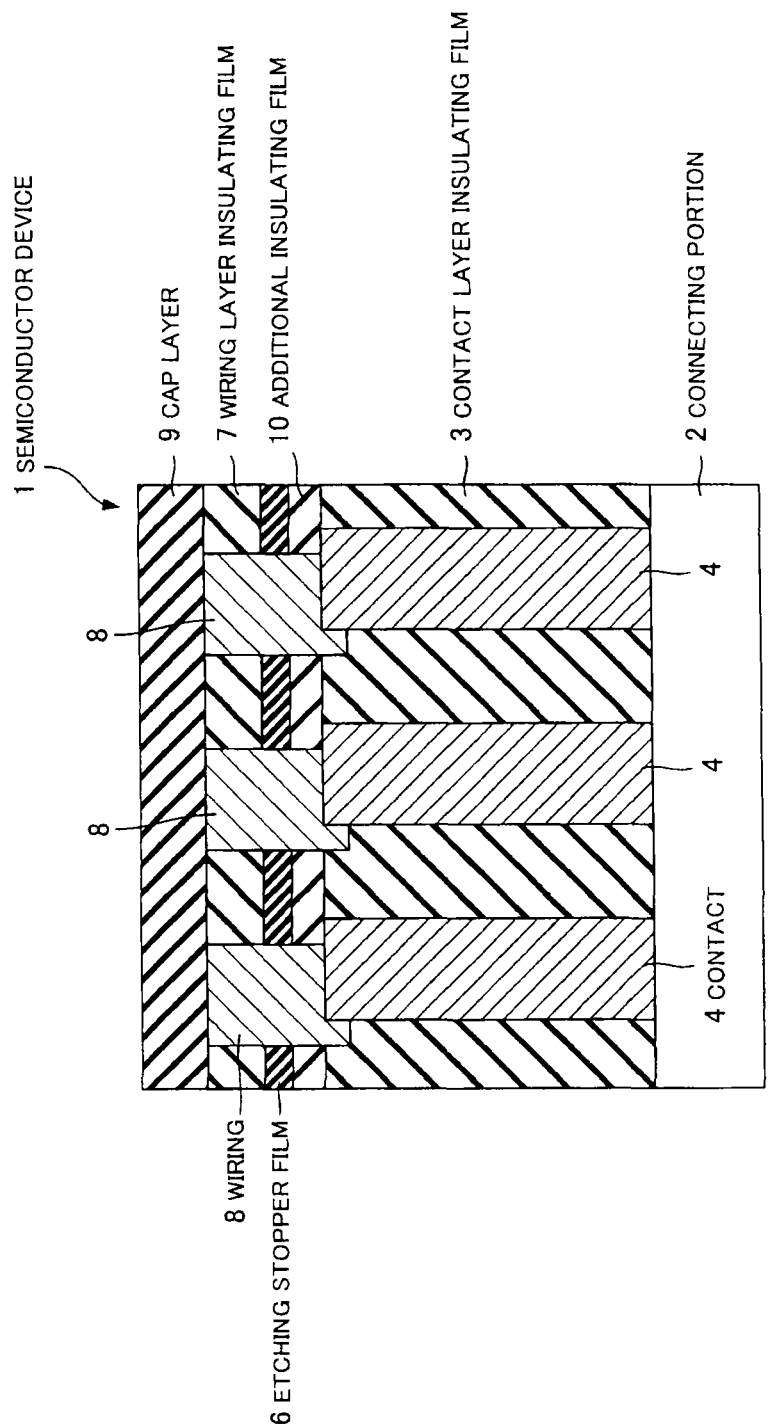
FIG. 5 is a cross sectional view of the semiconductor device according to a second embodiment.

FIG. 5 is a cross sectional view of the semiconductor device according to the second embodiment.

The contact layer insulating film 3 comprises, for example, Si oxide such as $SiO_2$, SiOC which is C-doped $SiO_2$, SiON which is N-doped $SiO_2$, SiOF which is F-doped $SiO_2$, BPSG which is B and P-doped $SiO_2$ or the like.

For a material of the additional insulating film 10, it is possible to use a material having permittivity lower than that of the etching stopper film 6. It is possible to reduce electric field concentration on the interface between the additional insulating film 10 and the contact layer insulating film 3 by using a material having low permittivity as a material of the additional insulating film 10, hence, it is possible to improve the leak-resistant characteristics and the voltage endurance characteristics of the semiconductor device 1. Therefore, compared with the case that the etching stopper film 6 is provided at a position for the additional insulating film 10, it is possible to lessen the electric field concentration on the interface with the contact layer insulating film 3 by using a material having permittivity lower than that of the etching stopper film 6. For example, when using SiN for the etching stopper film 6, SiON, SiOC, SiCN, a low-K material or the like having permittivity lower than SiN are used for the additional insulating film 10.

Furthermore, as a material of the additional insulating film 10, it is also possible to use a material having strong bonding strength between atoms contained in both of the additional insulating film 10 and the contact layer insulating film 3 on the interface thereof. For example, when using an Si compound film containing O such as $SiO_2$ or the like as the contact layer insulating film 3, it is possible to use an Si compound film containing O such as SiON, SiOC or the like as the additional insulating film 10. As a result, a strong bonding is generated between an $SiO_2$ film and an SiON film via O, and the bonding strength between the atoms contained in both of the additional insulating film 10 and the contact layer insulating film 3 on the interface thereof is strengthened, hence, it is possible to improve the leak-resistant characteristics and the voltage endurance characteristics of the semiconductor device 1.

Furthermore, in the same way, when using an Si compound film containing C such as an organic insulating material or the like as the contact layer insulating film 3, it is possible to use an Si compound film containing C such as SiCN, SiOC or the like as the additional insulating film 10.

Namely, in order to enhance the bonding strength between the atoms contained in both of the contact layer insulating film 3 and the additional insulating film 10 on the interface thereof, it is preferable that common elements except Si are contained in the material of the both. Furthermore, the bonding strength between the atoms contained in both of the contact layer insulating film 3 and the additional insulating film 10 on the interface thereof is preferably stronger than the bonding strength between the atoms contained in both of the etching stopper film 6 and the contact layer insulating film 3 on the interface thereof when directly forming the etching stopper film 6 on the contact layer insulating film 3.

According to the second embodiment, in the same way as the first embodiment, it is also possible to obtain the semiconductor device 1 having high leak-resistant characteristics and high voltage endurance characteristics when using a material different from that of the contact layer insulating film 3 for the additional insulating film 5.

Third Embodiment

A third embodiment is different from the first embodiment in a layout of the contact 4. The explanation will be omitted for the points same as the first embodiment.

Figure 6:
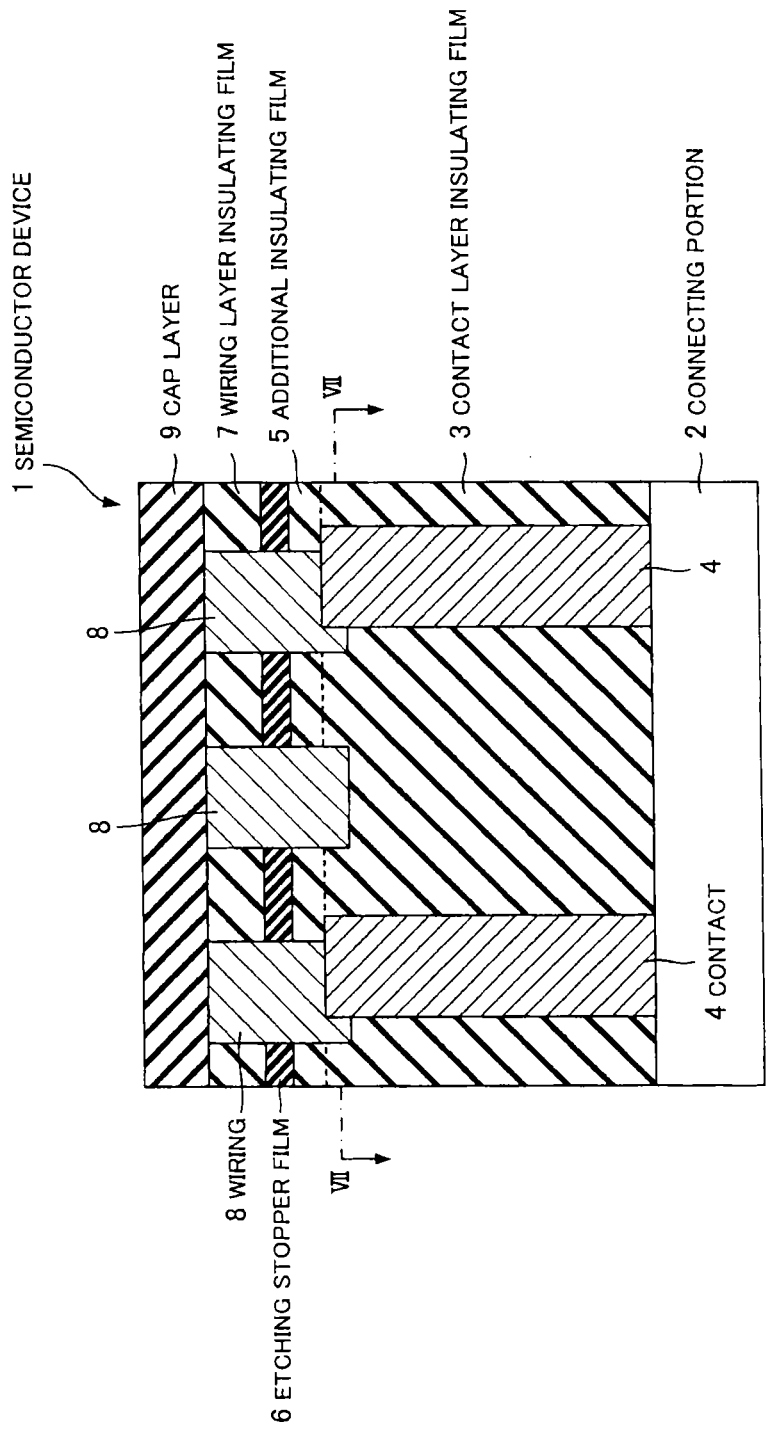
FIG. 6 is a cross sectional view of the semiconductor device according to a third embodiment.

FIG. 6 is a cross sectional view of the semiconductor device according to the third embodiment. Furthermore, FIG. 7A and FIG. 7B are cross sectional views when a cut surface taken on line VII-VII of FIG. 6 is viewed in a direction indicated by an arrow in the figure.

Figure 7A:
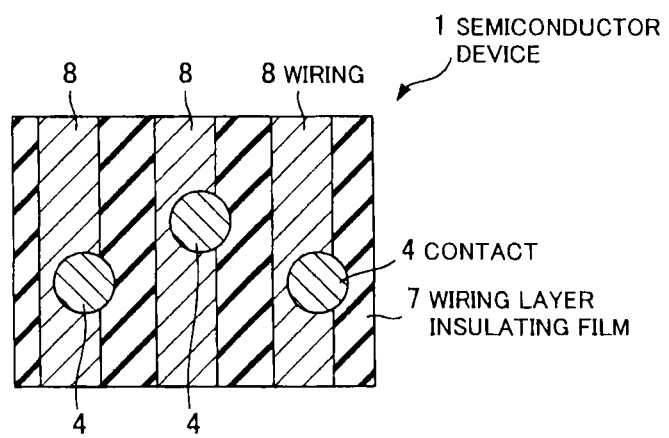
FIG. 7A and FIG. 7B are cross sectional views of the semiconductor device according to the third embodiment when a cut surface taken on line VII-VII of FIG. 6 is viewed in a direction indicated by an arrow in the figure.
Figure 7B:
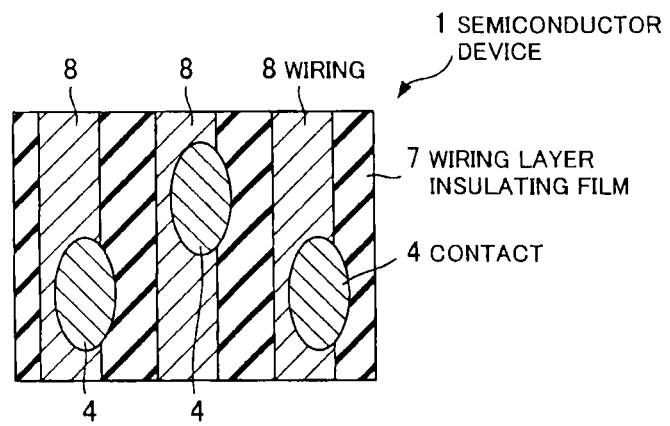

Although the shape of the contact 4 may be a nearly perfect circle as shown in FIG. 7A or an elliptical shape as shown in FIG. 7B, a plurality of adjacent contacts 4 are arranged to shift each other in a length direction of the wiring 8 without being arranged in a row. According to such arrangement, it is possible to increase the distance between the adjacent contacts 4. Furthermore, lithography resolution is improved by alternately arranging the contacts 4, and it is capable of forming the contact 4 further smaller in size.

However, when the distance between the contact 4 and the adjacent wiring 8 is the distance of closest approach L as this embodiment, the leak-resistant characteristics and the voltage endurance characteristics are determined between the wiring and the contact even if the distance between the adjacent contacts 4 are increased, therefore, it is difficult to greatly improve the leak-resistant characteristics and the voltage endurance characteristics only by separating the contacts. Therefore, even when the contact is formed in such layout, it is possible to improve the leak-resistant characteristics and the voltage endurance characteristics by adopting the wiring structure using the additional insulating film 5, in the same way as the first embodiment.

According to the third embodiment, since the leak-resistant characteristics and the voltage endurance characteristics between the wiring and the contact are improved, it is possible to obtain the same effect as the first embodiment even when the layout of the contact 4 is different from that of the first embodiment.

Fourth Embodiment

In a fourth embodiment, a width of the contact 4 with respect to the wiring 8 is larger than that of the first embodiment. The explanation will be omitted for the points same as the first embodiment.

Figure 8:
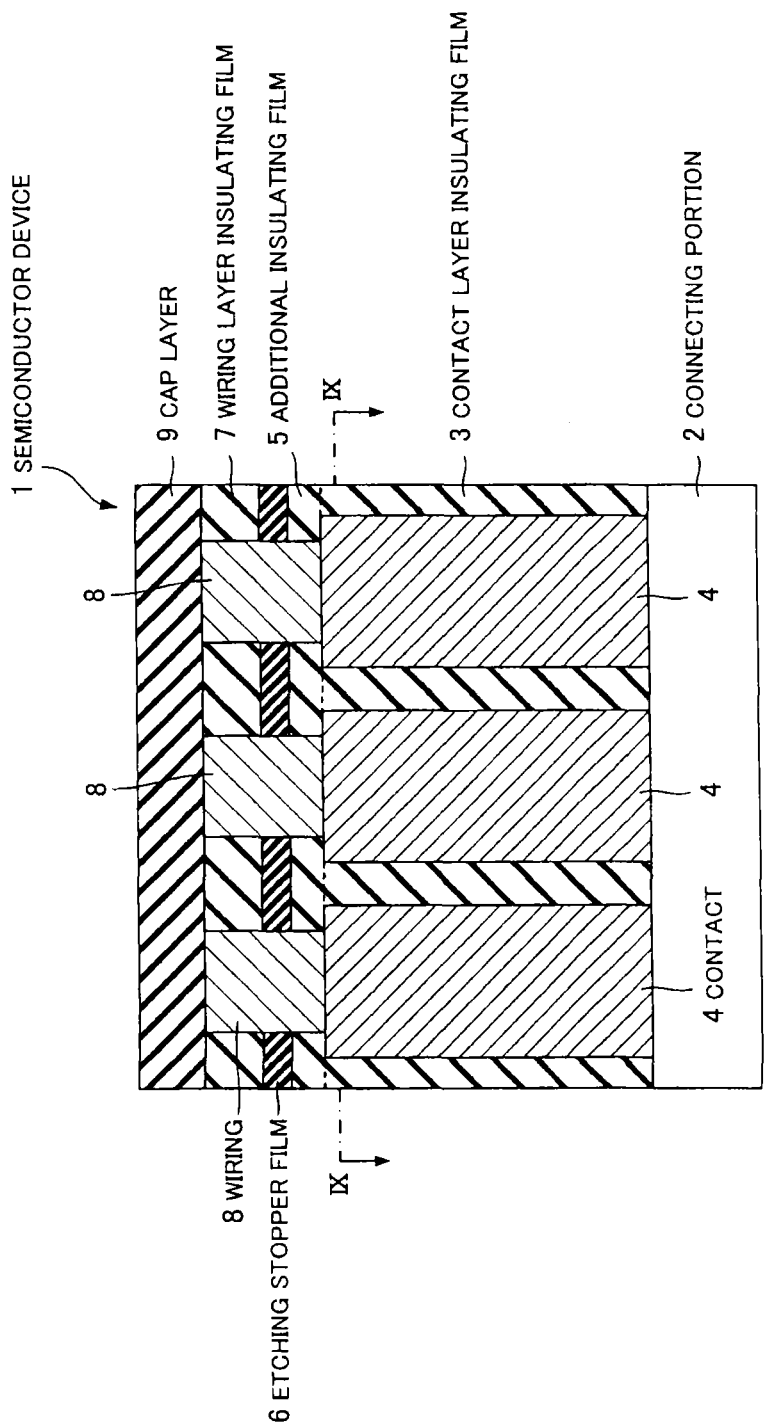
FIG. 8 is a cross sectional view of the semiconductor device according to a fourth embodiment.

FIG. 8 is a cross sectional view of the semiconductor device according to the fourth embodiment. Furthermore, FIG. 9A and FIG. 9B are cross sectional views when a cut surface taken on line IX-IX of FIG. 8 is viewed in a direction indicated by an arrow in the figure.

Figure 9A:
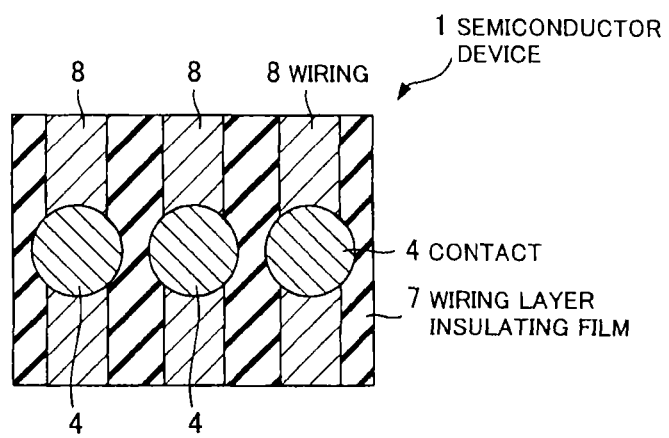
FIG. 9A and FIG. 9B are cross sectional views of the semiconductor device according to the fourth embodiment when a cut surface taken on line IX-IX of FIG. 8 is viewed in a direction indicated by an arrow in the figure.
Figure 9B:
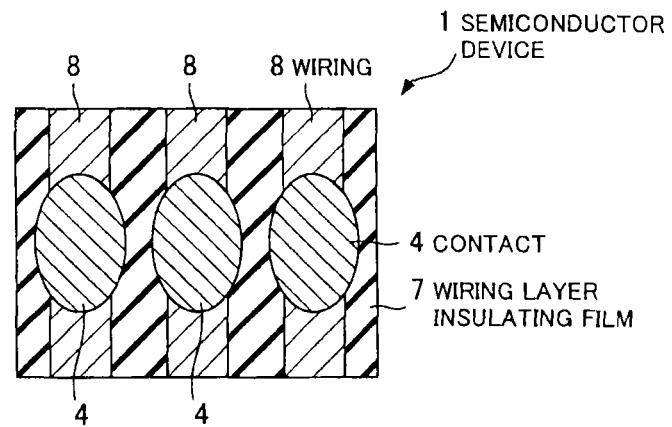

The shape of the contact 4 may be a nearly perfect circle as shown in FIG. 9A or an elliptical shape as shown in FIG. 9B, however, the width of the adjacent contacts 4 with respect to that of the wiring 8 is larger than that of the first embodiment. In such case, the distance between the adjacent contacts 4 is shorter than the distance between the adjacent wirings 8 and the distance between the contact 4 and the adjacent wiring 8, and becomes the distance of closest approach between the adjacent conductive members.

Even in such case, when the additional insulating film 5 is not formed, the distance of the path passing through the interface between the etching stopper film 6 and the contact layer insulating film 3 becomes the distance of closest approach between the adjacent conductive members, and the leak current and the breakdown are much more likely to occur. Therefore, it is possible to improve the leak-resistant characteristics and the voltage endurance characteristics by adopting the wiring structure using the additional insulating film 5 in the same way as the first embodiment.

According to the fourth embodiment, it is possible to obtain the same effect as the first embodiment by forming the additional insulating film 5 even when the distance between the adjacent contacts 4 is the distance of closest approach between the adjacent conductive members.

Fifth Embodiment

A fifth embodiment is different from the first embodiment in the position where the additional insulating film 5 is formed. The explanation will be omitted for the points same as the first embodiment.

Figure 10:
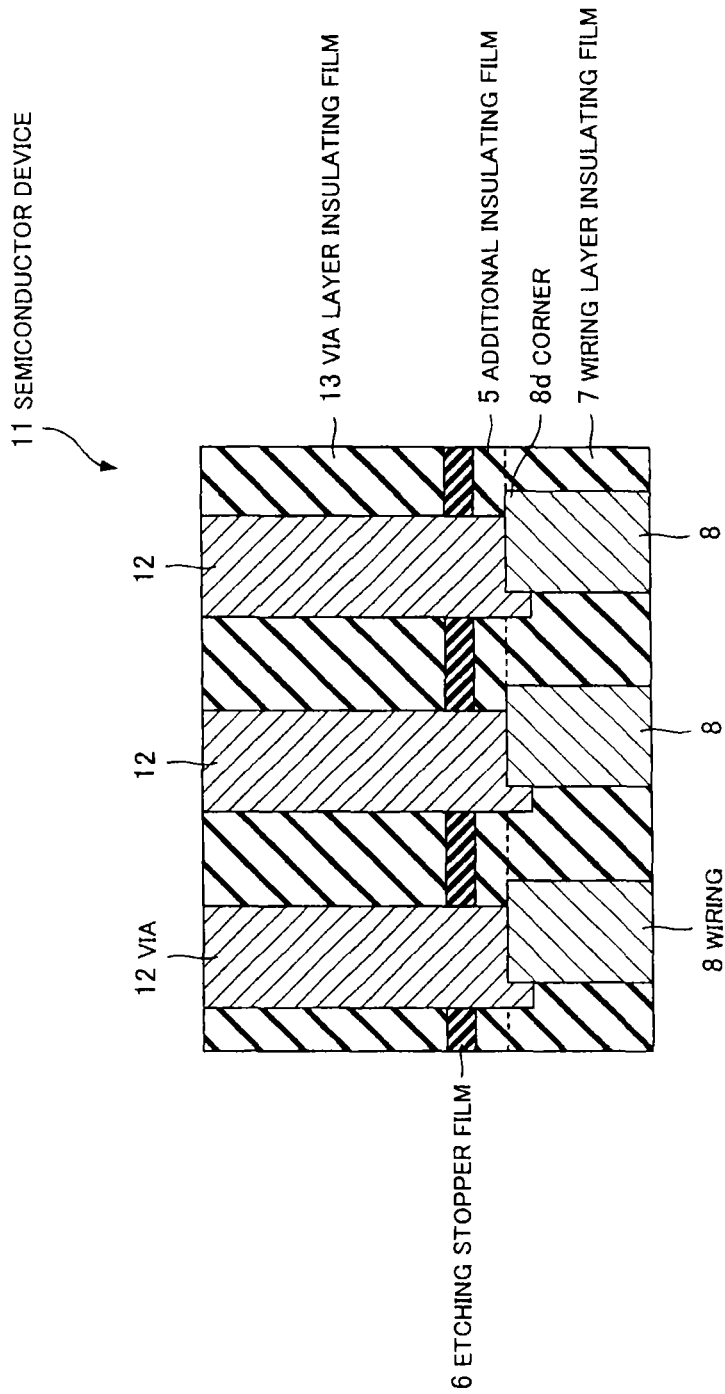
FIG. 10 is a cross sectional view of the semiconductor device according to a fifth embodiment.

FIG. 10 is a cross sectional view of the semiconductor device according to the fifth embodiment.

A semiconductor device 11 has a wiring 8, a wiring layer insulating film 7 formed on the same layer as the wiring 8, a via 12 formed on the wiring 8 and electrically connected to the wiring 8, an additional insulating film 5 formed on the wiring layer insulating film 7 so as to contact with a portion of an upper surface of the wiring 8 as well as a portion of a side surface of the via 12 and comprising the same material as the wiring layer insulating film 7, an etching stopper film 6 formed on the additional insulating film 5 so as to contact with a portion of the side surface of the via 12, and a via layer insulating film 13 formed on the etching stopper film 6 so as to contact with the side surface of the via 12. Note that, a layout of the via 12, the wiring 8 or the like is not limited to that shown in FIG. 10.

The via layer insulating film 13 comprises, for example, Si oxide such as $SiO_2$, SiOC which is C-doped $SiO_2$, SiON which is N-doped $SiO_2$, SiOF which is F-doped $SiO_2$, BPSG which is B and P-doped $SiO_2$ or the like.

For a material of the wiring layer insulating film 7, it is possible to use the same material as the via layer insulating film 13. Furthermore, an organic insulating material such as SiOCH, polymethylsiloxane, polyarylene, benzoxazole or the like may be used.

The etching stopper film 6 comprises an insulating material such as SiN, SiC, SiOC, SiCN, SiON or the like. Furthermore, since the etching stopper film 6 functions as an etching stopper when etching the via layer insulating film 13, it is preferable that the material of the etching stopper film 6 has a high etching selectivity with respect to the via layer insulating film 13.

The via 12 comprises, for example, a metal such as Cu, Al, Au, Ag, W or the like. Note that, the via 12 may have a structure having a barrier metal on the surface thereof for preventing diffusion of metals in the via 12. Furthermore, the cross-sectional shape of the via 12 may be a nearly perfect circle or an elliptical shape.

In the semiconductor device 1 according to this embodiment, similarly to the wiring 8 and the contact 4 in the first embodiment, there is a displacement between the position in which the via 12 is formed and the position in which the wiring 8 is formed, a distance between the wiring 8 and the adjacent via 12 becomes shorter than a distance between the adjacent wirings. Therefore, the distance between the wiring 8 and the adjacent via 12 is a distance of closest approach between adjacent conductive members.

In the semiconductor device 1 according to this embodiment, since the distance of the path passing through the interface between members comprising different materials is not the distance of closest approach between the adjacent conductive members due to an existence of the additional insulating film 5 between the wiring layer insulating film 7 and the etching stopper film 6 and between the wiring 8 and the etching stopper film 6, it is possible to inhibit the generation of the leak current and the breakdown when applying high voltage. Furthermore, since a corner 8c of the wiring 8 does not contact with the interface between members comprising different material, it is possible to inhibit the generation of the leak current and the breakdown, in the same way.

Note that, it is preferable that the additional insulating film 5 has a thickness of 3 nm or more for effectively inhibiting the generation of the leak current and the breakdown. It is because a uniform and stable film can be formed in a wafer plane by forming a film with a thickness of 3 nm or more.

According to the fifth embodiment, by forming the additional insulating film 5 between the wiring layer insulating film 7 and the etching stopper film 6 and between the wiring 8 and the etching stopper film 6, it is possible to prevent the distance of the path, which is passing through the interface between members comprising different materials, from becoming the distance of closest approach between the adjacent conductive members, to inhibit the generation of the leak current and the breakdown, and to improve leak-resistant characteristics and voltage endurance characteristics.

Furthermore, in the same way, it is possible to inhibit the generation of the leak current and the breakdown, and to improve the leak-resistant characteristics and the voltage endurance characteristics by isolating the interface between the members comprising different materials from the corner 8d of the wiring 8 to which electric field is focused.

Sixth Embodiment

A Sixth embodiment is different from the fifth embodiment in that an additional insulating film is applied in consideration of wiring pitches of other circuit regions or the like. The explanation will be omitted for the points same as the fifth embodiment.

Figure 11:
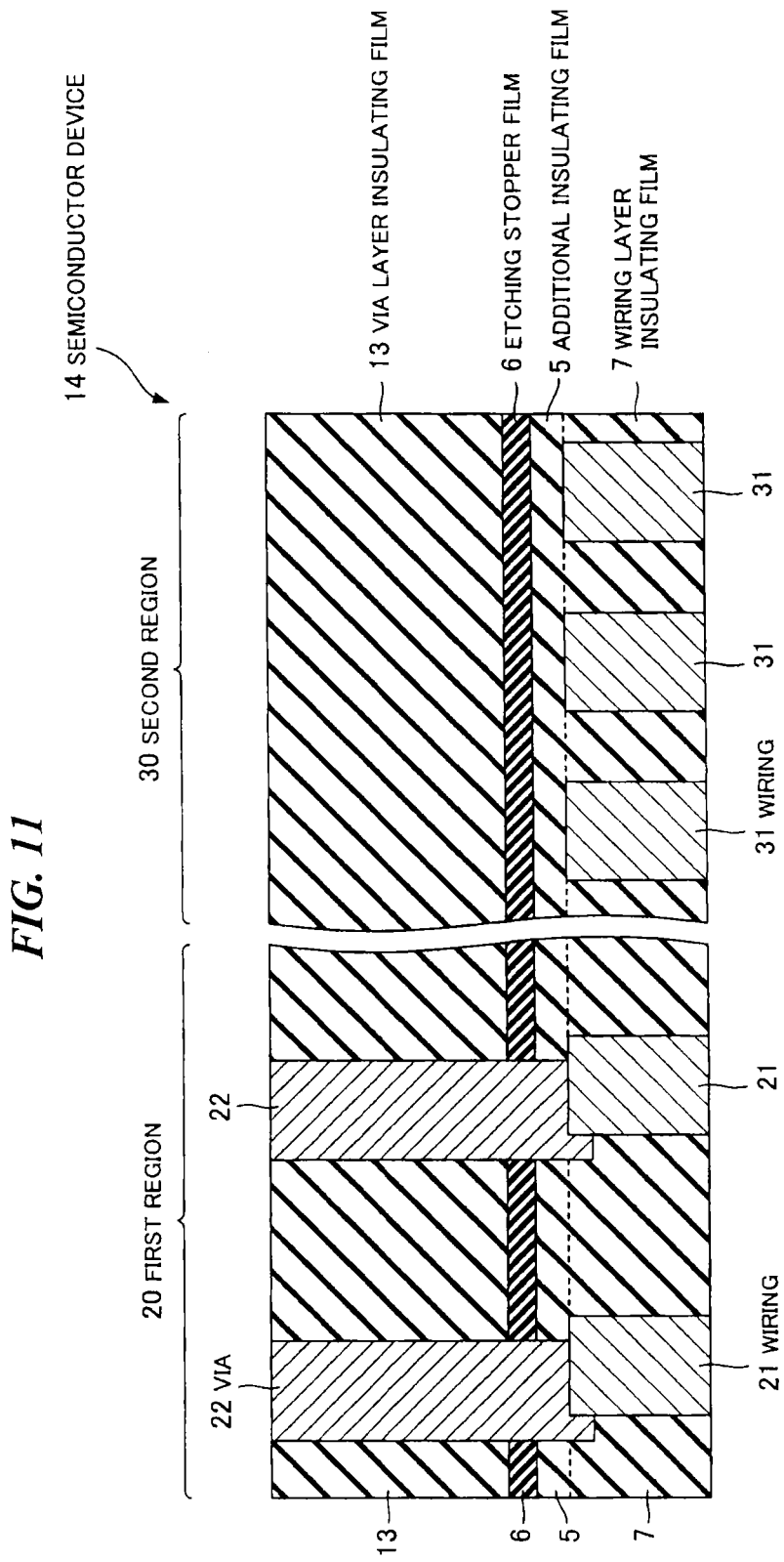
FIG. 11 is a cross sectional view of the semiconductor device according to a sixth embodiment.

FIG. 11 is a cross sectional view of the semiconductor device according to the sixth embodiment. A semiconductor device 14 has a first region 20 having a wiring in which a via is connected to the upper surface thereof and a distance between wirings is relatively large, and a second region 30 having a wiring in which a via is not connected to the upper surface thereof and a distance between wirings is relatively small.

The first region 20 includes a wiring 21, a wiring layer insulating film 7 formed on the same layer as the wiring 21, a via 22 formed on the wiring 21 and electrically connected to the wiring 21, an additional insulating film 5 formed so as to contact with upper surfaces of the wiring 21 and the wiring layer insulating film 7 as well as the side surface of the via 22 and comprising the same material as the wiring layer insulating film 7, an etching stopper film 6 formed on the additional insulating film 5 so as to contact with the side surface of the via 22, and a via layer insulating film 13 formed on the etching stopper film 6 so as to contact with the side surface of the via 22. Note that, a layout of the via 22, the wiring 21 or the like is not limited to that shown in FIG. 11.

The second region 30 includes a wiring 31 formed on the same layer as the wiring 21 of the first region 20, a wiring layer insulating film 7 commonly formed with the first region 20, an additional insulating film 5, an etching stopper film 6 and a via layer insulating film 13. Note that, a layout of the via 31 or the like is not limited to that shown in FIG. 11.

In the first region 20, since the distance between the adjacent wirings is relatively large, the leak current or the breakdown is not likely to occur between the adjacent wirings or between the wiring and the adjacent via even if it is conventionally used structure in which the additional insulating film 5 is not formed. However, since the etching stopper film 6 is commonly formed also in the second region 30 in which the distance between the adjacent wirings is relatively small, if the additional insulating film 5 is not formed, the leak current and the breakdown during high-voltage application are likely to occur between the adjacent wirings 31 via the interface between the etching stopper film 6 and the wiring layer insulating film 7.

Therefore, although the etching stopper film 6 is a required member when processing the via layer insulating film 13 in the first region 20, it is formed on the additional insulating film 5 for preventing the generation of the leak current or the breakdown in the second region 30.

According to the sixth embodiment, by forming the etching stopper film 6 required in the first region 20 on the additional insulating film 5, it is possible to prevent the distance of the path, which is passing through the interface between members comprising different materials, from becoming the distance of closest approach between the adjacent wirings 31, to inhibit the generation of the leak current and the breakdown, and to improve the leak-resistant characteristics and the voltage endurance characteristics of the semiconductor device 14.

Seventh Embodiment

A Seventh embodiment is different from the first embodiment in that a rim of the upper portion of the contact 4 is rounded. The explanation will be omitted for the points same as the first embodiment.

An example of the processes for fabricating the semiconductor device 1 according to this embodiment will be described hereinafter.

Figure 12:
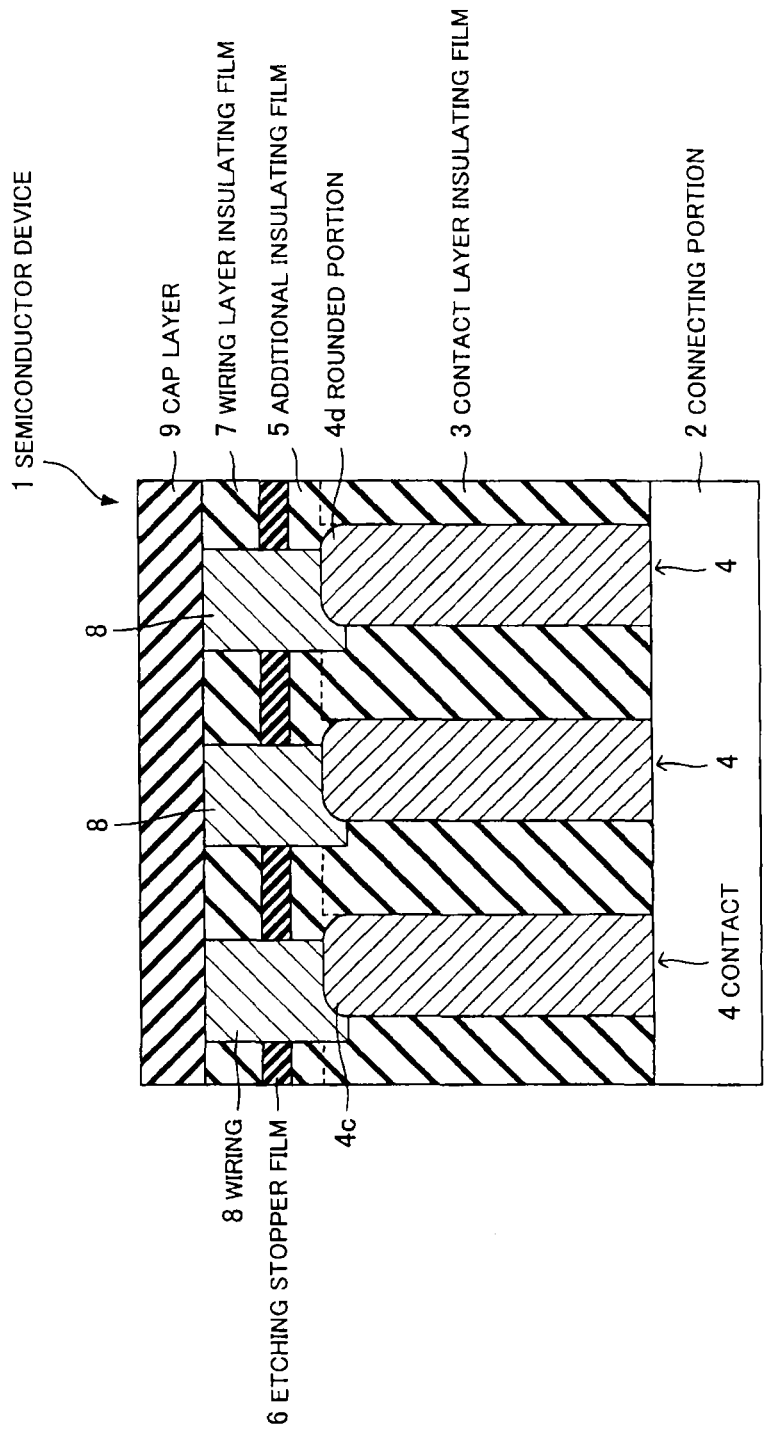
FIG. 12 is a cross sectional view of the semiconductor device according to a seventh embodiment.

FIG. 12 is a cross sectional view of the semiconductor device according to the seventh embodiment. The rim of the upper portion of the contact 4 is a rounded portion 4d without angles.

Figure 13A:
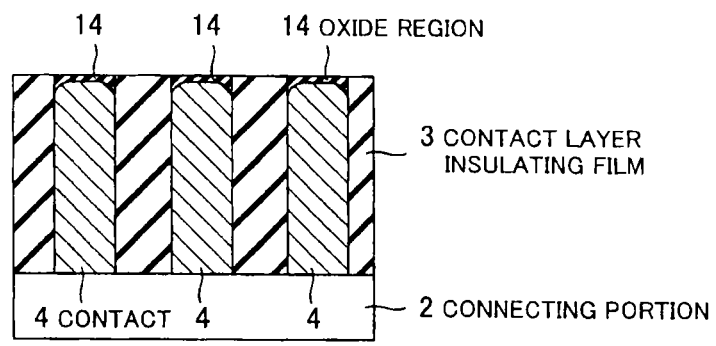
FIG. 13A to FIG. 13C are cross sectional views showing processes for fabricating the semiconductor device according to the seventh embodiment.
Figure 13B:
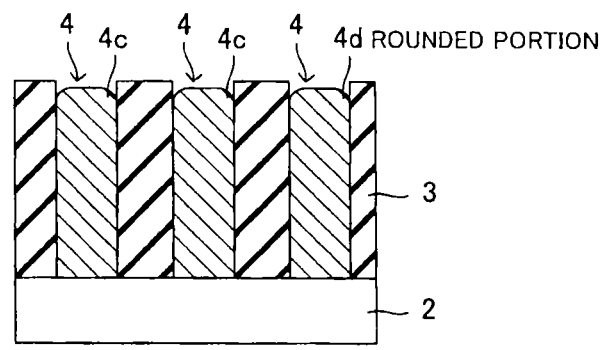
Figure 13C:
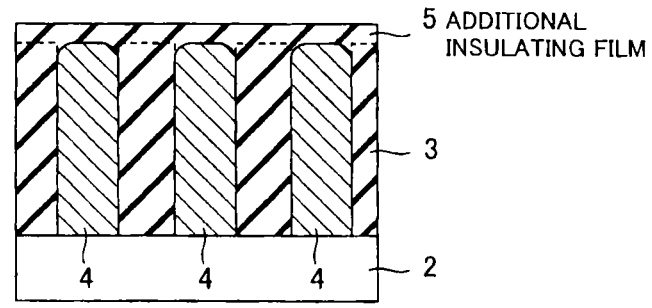

FIG. 13A to FIG. 13C are cross sectional views showing processes for fabricating the semiconductor device according to the seventh embodiment.

Firstly, the processes until the process, shown in FIG. 4C, for forming the contact 4 are carried out in the same way as the first embodiment.

Next, as shown in FIG. 13A, an oxide region 14 is formed by applying oxidation treatment to the upper surface of the contact 4. The oxide region 14 is formed so that a region closer to the rim of the upper surface of the contact 4 is deeper.

Next, as shown in FIG. 13B, the oxide region 14 is removed by wet etching using aqueous solution of choline or the like. By removing the oxide region 14, the rim of the upper surface of the contact 4 becomes the rounded portion 4d which is round and without angles.

Next, as shown in FIG. 13C, the additional insulating film 5 is formed on the contact layer insulating film 3 and the contact 4 by the CVD method or the like.

After that, the processes after the process, shown in FIG. 4E, for forming the etching stopper film 6 and the wiring layer insulating film 7 are carried out in the same way as the first embodiment.

According to the seventh embodiment, by making the rim of the upper surface of the contact 4 to be a rounded portion 4d, it is possible to prevent the electric field from focusing at the rim and to improve the voltage endurance characteristics of the semiconductor device 1.

Other Embodiments

It should be noted that an embodiment is not intended to be limited to the above-mentioned first to seventh embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device, comprising:
   a semiconductor substrate;
   a first conductive member formed on the semiconductor substrate, the first conductive member being a contact having a shape of a circle or an elliptical shape in plan view;
   a first insulating film formed on the same layer as the first conductive member;
   a second conductive member having a side surface and a bottom surface, and formed so the bottom surface contacts with a portion of an upper surface of the first conductive member, the second conductive member being a wiring that extends beyond the first insulating film in plan view;
   a second insulating film formed on the first insulating film so as to contact with a portion of the upper surface of the first conductive member, and including at least one type of element among elements contained in the first insulating film except Si; and
   a third insulating film formed on the second insulating film so as to contact with a portion of the side surface of the second conductive member, and having an upper surface located below the upper surface of the second conductive member.

2. The device of claim 1, wherein the third insulating film has a permittivity higher than the second insulating film.

3. The device of claim 1, wherein the second conductive member contacts a portion of a side surface of the first conductive member.

4. The device of claim 3, wherein a lower surface of the second conductive member is located below an upper surface of the first conductive member.

5. The device of claim 1, wherein the third insulating film is an etching stopper film.

6. The device of claim 1, wherein the second insulating film is made of a substantially same material as the first insulating film.

7. The device of claim 1, comprising:
   a plurality of the first and second conductive members formed at predetermined arranging intervals; and
   a plurality of third conductive members formed at arranging intervals smaller than the predetermined arranging intervals on the same layer as the first conductive member, and having upper surfaces contacting with the second insulating film.

8. The semiconductor device according to claim 1, wherein an upper rim of the first conductive member is a rounded portion without angles.

9. The semiconductor device according to claim 1, wherein a plurality of the second conductive members are formed at predetermined arranging intervals; and
   a plurality of the first conductive members are formed so that adjacent first conductive members are arranged shifting in a length direction of the second conductive member without being arranged in a row.

10. The semiconductor device according to claim 9, wherein the second insulating film is formed to a thickness of about 3 nm or more.

11. The semiconductor device according to claim 1, wherein the second insulating film is made of substantially a same material as the first insulating film.

12. The semiconductor device according to claim 1, wherein the first and second insulating films include at least one of O and C.

13. The semiconductor device according to claim 1, wherein the second insulating film is formed using a material having a permittivity lower than that of the third insulating film.

14. The semiconductor device according to claim 1, wherein the third insulating film is formed using SiN; and
   the second insulating film is formed using one of SiON, SiOC, SiCN, and a low-K material.

15. The semiconductor device according to claim 1, wherein an upper surface of the first conductive member is provided in a substantially same vertical position on an interface between the first insulating film and the second insulating film.

16. The semiconductor device according to claim 1, wherein a plurality of the first conductive members and a plurality of the second conductive members are formed at predetermined arranging intervals, respectively, so that a distance between adjacent first and second conductive members is shorter than a distance between adjacent first conductive members and a distance between adjacent second conductive members.

17. The semiconductor device according to claim 1, wherein a plurality of the first conductive members and a plurality of the second conductive members are formed at predetermined arranging intervals, respectively, so that a distance between adjacent first conductive members is shorter than a distance between adjacent second conductive members and a distance between adjacent first and second conductive members.

18. The semiconductor device according to claim 1, wherein the second insulating film is formed so as to contact with a portion of a side surface of the second conductive member.

19. A semiconductor device, comprising:
   a semiconductor substrate;
   a first conductive member formed on the semiconductor substrate, the first conductive member being a contact having a shape of a circle or an elliptical shape in plan view;
   a first insulating film formed on the same layer as the first conductive member;
   a second conductive member having a side surface and a bottom surface, and formed so the bottom surface contacts with a portion of an upper surface of the first conductive member, the second conductive member being a wiring that extends beyond the first insulating film in plan view;

a second insulating film formed on the first insulating film so as to contact with a portion of the upper surface of the first conductive member; and a third insulating film formed on the second insulating film so as to contact with a portion of the side surface of the second conductive member, having an upper surface located below the upper surface of the second conductive member, and a permittivity higher than that of the second insulating film.

20. The semiconductor device according to claim 19, wherein the second insulating film is made of substantially a same material as the first insulating film.

21. The semiconductor device according to claim 19, wherein the second insulating film is formed to a thickness of about 3 nm or more.

22. The semiconductor device according to claim 19, wherein the second insulating film is formed so as to contact with a portion of a side surface of the second conductive member.

* * * * *